United States Patent [19]

Tamai et al.

[11] Patent Number: 4,904,902
[45] Date of Patent: Feb. 27, 1990

[54] ION IMPLANTING SYSTEM

[75] Inventors: Tadamoto Tamai, Tokyo; Masateru Sato, Saijo, both of Japan

[73] Assignee: Sumitomo Eaton Nova Corporation, Tokyo, Japan

[21] Appl. No.: 181,765

[22] Filed: Apr. 14, 1988

[30] Foreign Application Priority Data

Apr. 16, 1987 [JP] Japan ................................. 62-93931

[51] Int. Cl.⁴ ......................... H01J 7/24; H05B 31/26; G21K 27/02
[52] U.S. Cl. ............................. 315/111.81; 250/492.2
[58] Field of Search ................ 315/111.81; 313/359.1, 313/362.1; 250/492.21; 156/643

[56] References Cited

U.S. PATENT DOCUMENTS 4,675,530 6/1987 Rose et al. ....................... 250/492.21
4,775,796 10/1988 Purser et al. ..................... 250/492.21

FOREIGN PATENT DOCUMENTS 0087746 5/1983 Japan ............................. 315/111.81

Primary Examiner—Eugene R. LaRoche
Assistant Examiner—Michael B. Shingleton
Attorney, Agent, or Firm—Armstrong, Nikaido, Marmelstein & Kubovcik

[57] ABSTRACT

In an ion implanting apparatus, a first conductor member for monitoring the charge-up of the workpiece is positioned on the front face of a wafer disk, a second conductor member electrically connected with the first conductor member for distributing the charge on the first conductor member is positioned on the rear face of the wafer disk, and a third conductor capable of forming capacitive coupling with the second conductor member is fixed to a disk chamber. When the first conductor member is charged, the charge is distributed also to the second conductor member. When the second conductor member passes by the third conductor member by the rotation of the disk, charge is induced on the third conductor member depending on the charged state of the second conductor member. The first, the second and the third conductor members can be effectively shielded from the surroundings. Charge detection with a high S/N ratio is made possible.

10 Claims, 9 Drawing Sheets

ION IMPLANTING SYSTEM

BACKGROUND OF THE INVENTION

1. Field of the Invention

This invention relates to an ion implanting system, and more particularly to an ion implanting system equiped with a charge neutralizing facility.

2. Description of the Related Art

Ion implantation is a technique of doping a certain species of ions into a workpiece, used, e.g., for forming regions of desired conductivity of desired type in a semiconductor body. Especially in semiconductor industries, ion implantation is widely used for accurately forming shallow regions of desired impurity concentration.

Ions are charged particles. Ion-implanted workpieces receive the charge of the implanted ions. Further, ions being implanted are energetic particles usually having an energy of several KeV to several hundreds KeV, capable of emitting secondary electrons from the ion-implanted bodies. Thus, there are various charges in an ion implanting system. There arises the problem of charge-up in insulators and isolated conductors disposed in the ion implanting apparatus.

Semiconductor wafers for manufacturing semiconductor devices have insulating bodies such as oxides and isolated conductors such as insulated gate electrodes. Metal-insulator-semiconductor (MIS) structure forms a capacitance C which generates a voltage V upon storing of charge Q, $V = Q/C$. For example, in implanting positive cations into wafers in an ion implanting apparatus, if a great amount of cations are accumulated on a conducting film disposed on an insulating film, such as a gate oxide formed on the wafer, there is generated a high voltage across a MIS capacitor, which may cause break-down of the nsulating film. Such destruction of insulating films destroys the pattern in the LSI and lowers the yield of LSI manufacture. For protecting workpieces from the damages by the charge-up, it can be considered to reduce the charges in the ion implanting apparatus, or to give charges of opposite polarity in response to charge-ups, thereby neutralizing the charge. Ions to be implanted are in most cases cations which are created by removing electrons from the atoms. Electrons may be superposed on the cations for neutralizing the charge of cations. It has been proposed to provide an electron shower in the vicinity of wafers, to deliver electrons to the wafers being ion-implanted, thereby neutralizing charge of wafers due to the cations. In employing this method, it is desirable to continuously monitor the charge-up of the wafers being ion-implanted, and to control the neutralization to minimize the charge on the wafers. Excessive supply of electrons will charge the wafers negatively.

It has been proposed to dispose a conductor in front of the wafer to oppositely face it and to form capacitive coupling therewith, for monitoring the charge on the wafer. In the case where a plurality of wafers are disposed on a rotating disk and successively subjected to ion implantation, a stationary charge sensor may face and sense the charge on a rotating isolated conductor which approaches and departs the sensor at a relatively high speed. The detection accuracy, however, is not sufficiently high and improvements are highly desired.

SUMMARY OF THE INVENTION

An of the present invention is to provide an ion implanting technique which can accurately determine the charge on a workpiece.

Another object of the present invention is to provide an ion implanting apparatus which can determine the charge on workpieces mounted on a rapidly rotating disk during ion implantation.

A further object of the present invention is to provide an ion implanting apparatus which can precisely determine the amount of charge on a workpiece mounted on a disk rotating at a high speed during ion implantation and can precisely neutralize the charge with electrons.

On the front face of the workpiece-mounting disk which is exposed to the ion beam, there are various structures such as susceptors for mounting workpieces, clamps for fixing the workpieces, resulting in an uneven face. Also, there should be a space for allowing the passage of an ion beam. There are various restrictions on provision of a charge sensor on the front face of the disk and the signal obtained has been accompanied with much noise.

According to an embodiment of the present invention, based on the above consideration, a conductive member is positioned on the front face of a rotating disk in a beam-irradiated area with an intervention of an insulation member, another conductive member which can serve as a reservoir or distributor for charge is mounted on the rear face of the disk with an intervention of another insulating member, and a stationary capacitor electrode is disposed in a place adapted to face the another conductive member on the rear face of the disk with a small gap therebetween so that a static charge sensor is formed. The conductive members on the front and the rear faces of the disk are electrically connected to form one capacitor plate of the static charge sensor. For example, a stationary capacitor electrode formed of a metal plate is disposed in the vicinity of the passage of the afore-mentioned another conductive member on the rear face of the disk to face the another conductive member and to form a capacitor. In response to the charge on the conductive members on the rotating disk, a corresponding charge is induced on the stationary capacitor electrode when capacitive coupling is established. Along with the rotation of the disk, the rear conductive member approaches and departs the stationary capacitor plate and hence the coupling capacitance increases and decreases cyclically. There occurs a current flow into and from the stationary electrode and also there is formed a voltage variation across the capacitance. On the rear surface of the wafer disk, there are no particular structures which prevent the flat configuration of the capacitor forming conductors, enabling high S/N ratio of the detection signal. The S/N ratio can be further increased by surrounding the capacitor forming conductors with shield members.

DESCRIPTION OF THE PREFERRED EMBODIMENTS

Figure 1:
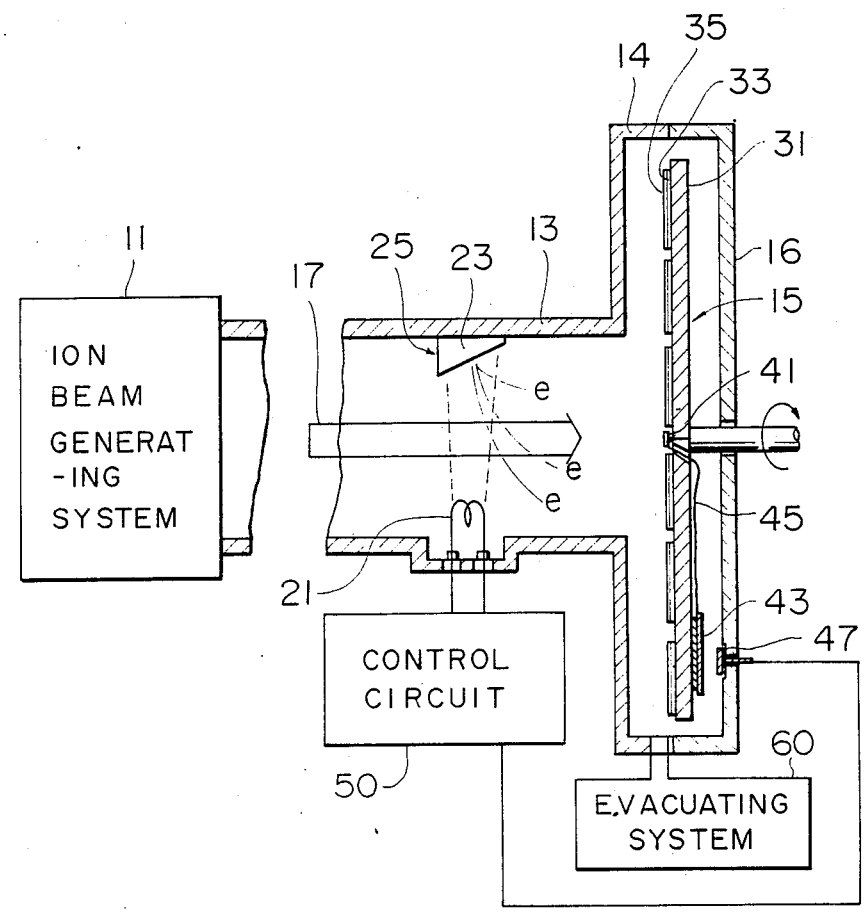
FIG. 1 is a cross-section of an ion implating system according to a basic embodiment of the present invention.

FIG. 1 shows schematically an ion implanting system according to an embodiment of the present invention.

An ion beam generating unit 11 generates an ion beam 17 of a predetermined ion species and supplies the ion beam 17 to a wafer disk chamber 15 through an ion beam housing 13 formed e.g. of aluminum. At a location in the ion beam housing 13, there is provided an electron shower 25 which includes a filament 21 forming a primary electron source and a target 23 formed of e.g. aluminum and serving as a secondary electron source. The disk chamber contains a wafer disk 31 which is formed of e.g. aluminium and rotates at a very high speed. The wafer disk 31 is equiped, on its front surface, with a plurality of wafer susceptors 33 which may be either metal or insulator, for mounting a plurality of semiconductor wafers 35 thereon. On the front surface of the wafer disk 31, a charge receiving conductor member 41 formed of e.g. aluminum is placed to have a surface level substantially coplanar with the wafer surface near a wafer or a pseudo-wafer while being insulated from the wafer disk 31. On the rear surface of the wafer disk 31, another conductor 43 formed of aluminum etc., and insulated from the disk 31, is disposed and connected with the charge receiving conductor 41 on the front surface through a conducting wire 45 coated with an insulator such as teflon. A stationary capacitor electrode 47 is disposed in the vicinity of the rotating passing of the rear conductor 43 to face the rotating and charge inducing conductor 43 and form a capacitive coupling therwith. The stationary capacitor electrode 47 is connected to a control circuit 50. The control circuit 50 controls the output of the electron shower 25 to reduce the piled-up charge, based on the signal received through the capacitor electrode 47. An evacuating system 60 is connected to the disk chamber 15 for evacuating the disk chamber 15.

Now, description will be made on the operation of the ion implantation. Wafers 35 are set on the susceptors 33 on the front face of the wafer disk 31. The disk chamber 15 is evacuated by the evacuating system 60. An ion beam 17 is generated by the ion beam generating unit 11 and is irradiated on the wafers 35 located on the rotating wafer disk 31. At this moment, the charge receiving conductor 41 positioned near the wafer susceptors 33 is also irradiated by the ion beam and may be charged up. As stated before, the charge receiving conductor or susceptor conductor 41 is connected with the rear conductor 43 through the conductor member 45, but is isolated from the wafer disk 31. Therefore, the conductors 41, 43, and 45 will be charged by the reception of charge carrying ions. When the rear conductor 43 and the stationary conductor 47 face each other, a capacitance C is established. In dependence with the amount of charge stored on the conductor 43, charge will be induced on the stationary capacitor electrode 47. Since the wafer disk 31 is rotating, the charge induced on the capacitor electrode 47 will change cyclically and increases the peak value when the stored charge becomes high. Such induced amount of charge is detected e.g. as an alternating current signal. The control circuit 50 detects the charge received on the charge-receiving conductor 41. Based on the detection signal, the control circuit 50 controls the electron shower to emit electrons, thereby neutralizing the charge-up due to the ions. Along with the irradiation of electrons on the charge receiving conductor 41, the amount of charge on the conductor 41 is reduced and the signal induced on the capacitor electrode 47 will be reduced. By detecting such change in the detection signal, the control circuit 50 adjusts the output of the electron shower 25 at an optimum level.

Figure 2:
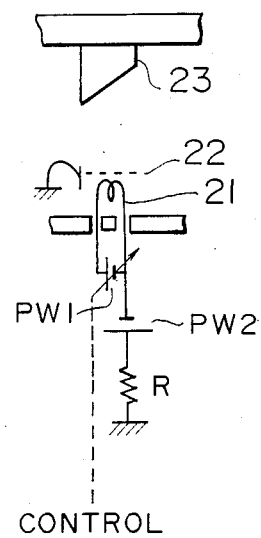
FIG. 2 is a schematic cross-section of an electron shower shown in FIG. 1.

An example of the interconnection and the control of the electron shower is illustrated in FIG. 2. A power source PW1 heats the filament. Another power source PW2 applies a negative voltage of several hundreds volts to the filament 21 with respect to the grounded aperture 22 so as to accelerate the electrons between the filament 21 and the aperture 22. The amount of electrons emitted from the filament 21 is measured through the use of a resistor R and the power source PW1 is controlled to keep the current constant. The accelerated and emitted electrons are directed to the target 23 which is formed of aluminum, etc. and emits multiplied secondary electrons.

Figure 3:
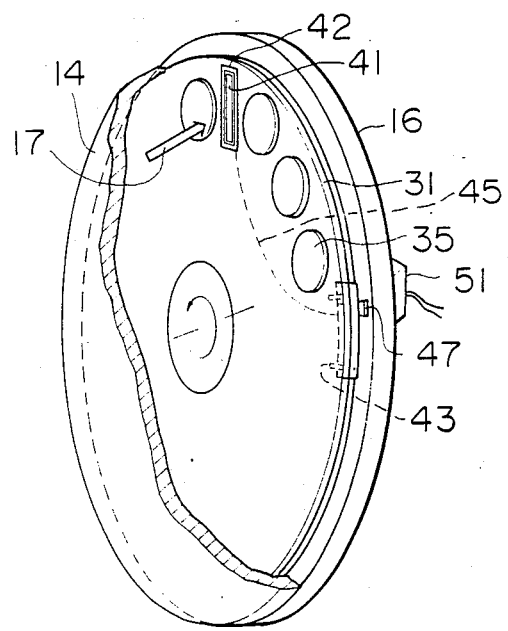
FIG. 3 is a partially broken perspective view of an ion implanting system according to a more practical embodiment of the present invention.

FIG. 3 shows a more practical ion implanting system according to another embodiment of the invention. An ion beam 17 generated by an ion beam generating unit (not shown) irradiates a multiplicity of wafers 35 mounted on a wafer disk 31. Normally, the ion beam of uniform intensity has not so large diameter compared with the diameter of semiconductor wafers. Scanning is then necessary for irradiating the whole surface of each wafer. Also, since ion implantation is a process carried out in an evacuated atmosphere, the number of wafers which can be processed in a batch, is preferably as large as possible.

Figure 4:
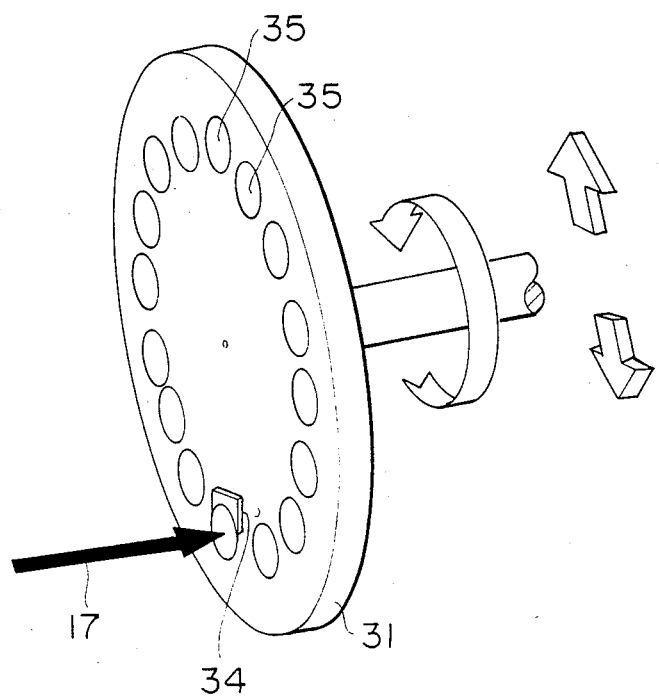
FIG. 4 is a schematic perspective view showing the relation between the ion beam and the disk in the structure of FIG. 3.

FIG. 4 shows a relation between the ion beam 17 and the disk 31. The disk 31 rotates at a very high speed, thereby implanting ions 17 to the multiplicity of wafers disposed on the circumferential portion of the wafer disk 31. The disk 31 is further moved up and down slowly to effect scanning in the radial direction of the wafer disk 31. In this way, a multiplicity of semiconductor wafers 35 can be wholly irradiated by the ion beam 17 to a predetermined dose.

Figure 5:
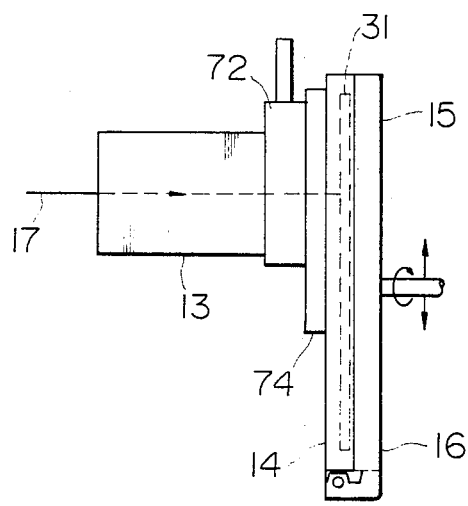
FIG. 5 is a partial schematic illustration showing the connection between the ion beam channel and the disk chamber in the structure of FIG. 3.

FIG. 5 shows the connection between an ion chamber 15 for containing the wafer disk 31 and an ion beam channel 13 through which the ion beam 17 passes. The ion beam housing 13 is fixed. The disk chamber 31 is connected with the housing 13 through a gate valve 72 and a sliding seal 74. The disk chamber 15 is moved up and down with the up-and-down scanning of the wafer disk 31. Here, the sliding seal 74 allows the relative translation movement of the housing 13 and the chamber 15 and keeps the hermetic seal therebetween. The disk chamber 15 is defined by a chamber body 14 and a chamber cover 16 which is coupled by a hinge structure so as to enable the replacement of wafers. At the replacement of wafers, the gate valve 72 is closed to keep the housing 13 at a high vacuum.

Figure 6:
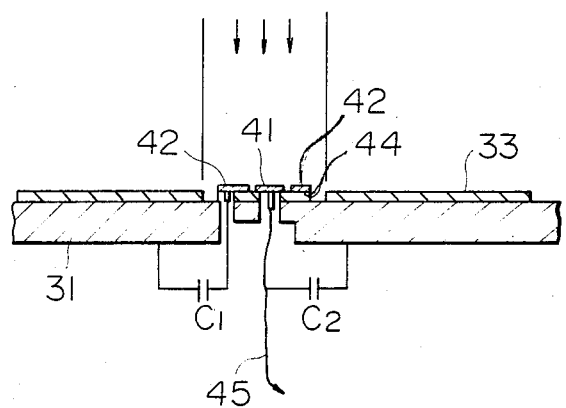
FIG. 6 is a cross-section seen from A of FIG. 3.

In FIG. 3, a multiplicity of wafer susceptors 33 are disposed on a peripheral portion of the wafer disk 31. Each wafer susceptor may be formed by covering an aluminum base with a thin sheet of silicone rubber. Each wafer susceptor 33 is equiped with a clamp mechanism 34 as shown in FIG. 4. A wafer is clamped by aluminum clamps at several points on the peripheral portion. The susceptor 33 is angled relative to the disk surface to some extent so that a centrifugal force will press the wafer 35 onto the susceptor 33 when the disk 31 is rotating. A strip conductor 41 is disposed between a pair of wafer susceptors 33. As shown in FIG. 6, the conductor 41 is placed on the wafer disk 31 with an intervention of a sheet 44 of teflon or silicone rubber. This conductor member 41 may be formed of any conducting material, but is preferably formed of the same material as the wafer 35 for preventing the occurrence of contamination. The strip conductor 41 serves as a charge receiving conductor, and has a length sufficient to cover the whole scan length in the radial direction of the wafer disk. As described before, the wafer disk 31 repeats slow radial scan in a span of about the diameter of the mounted wafers together with high speed azimuthal scan. For enabling instantaneous monitoring of charge-up on wafers at any moment, the conductor strip 41 should be able to receive the incoming ions at any position of the scan. Therefore, the conductor strip 41 has a length to cover the whole radial scanning span. A conductor frame 42 surrounds the strip conductor 41. The conductor frame 42 is insulated from the conductor strip 41 and is mounted on the wafer disk 31 with the intervention of an insulator sheet 44 (see FIG. 6). This conducting frame 42 serves to prevent the entering of secondary electrons into the conductor 41, which electrons may be generated from the wafer disk, etc. upon irradiation of the ion beam, and may neutralize the charge due to the irradiation of ions. Thus, the real amount of charge-up is enabled to be measured.

Figure 7:
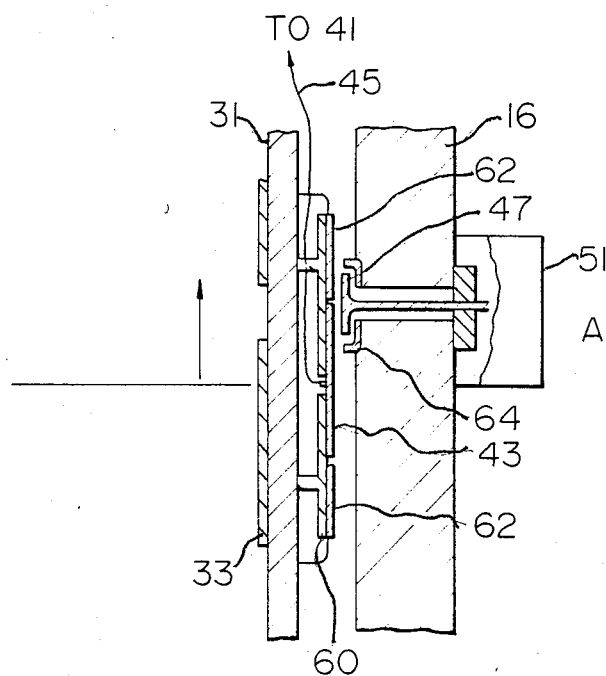
FIG. 7 is a cross-section seen from B of FIG. 3.

Referring to FIG. 6, conducting wire 45 is connected to the rear surface of the conductor strip 41. The other end of the conductor wire 45 is electrically connected to charge-inducing conductor 43 of strip shape mounted on the rear surface of the wafer disk 31 with an intervention of an insulator sheet 60 (see FIG. 7). The charge inducing rear conductor 43 may be formed of a material of high electrical conductivity such as aluminum, copper, or brass, and extends in the azimuthal direction by a certain length or a certain angle. It would be a good method for detecting charge on a rotating disk 31 to provide an electrode fixed on a stationary housing and facing to the charged wafer to measure the charge induced on the stationary electrode. When one tries to carry out this concept on the front surface of the wafer disk, it is found that the detection accuracy cannot be sufficiently high due to the accompanying noise. On the front face of the wafer disk, there are wafer susceptors, wafer clamps, etc. which make the contour of the front surface necessarily uneven. Such uneven surface changes the coupling capacitance and produces noises. Also, since the position of the instantaneous irradiation of the ion beam and that of the charge detecting member should be different for allowing the passage of the ion beam, the detection under the real irradiation of an ion beam is not possible. Therefore, while the conductive strip 41 for monitoring the charge-up due to the ion implantation is placed on the front surface which is exposed to the ion beam, a capacitor electrode 43 for establishing a capacitive coupling with another capacitor electrode on the stationary side and influencing the induced charge on the stationary capacitor electrode is mounted on the rear surface of the wafer disk 31. The front and the rear conductors are connected with the wire conductor 45. By such a configuration, signal detection on the rear side which is simple in structure and hence enables a capacitive coupling of high S/N ratio is made possible.

Similar to the case of the charge receiving conductor 41, a disturbance preventing conductor 62 is provided on the wafer with an intervention of an insulator sheet 60 around the charge inducing rear conductor 43, while being isolated from the rear conductor 43. The static charge inducing conductor 43 and the disturbance preventing conductor 62 are arranged to be coplanar to form a common surface. The disturbance preventing conductor 62 is electrically connected with the wafer disk 31.

A stationary capacitor electrode 47 for sensing the charge is disposed at a position facing the passage of the charge inducing conductor 43 on the rear face of the wafer disk 31, for detecting the charge through capacitive coupling. The stationary electrode 47 includes a head portion formed of a continuous plate of good conductor (e.g. aluminum, copper, brass, etc.) disposed in the vicinity of the charge inducing conductor 43 with a small gap formed therebetween. The stationary capacitor electrode 47 is surrounded by a conducting cover member 64 which is grounded to the disk chamber cover 16 for shielding out the external disturbance. The stationary capacitor electrode 47 is connected through an amplifier 51 to e.g. a current meter, thereby to detect the charge state of the rear conductor 43 by the change in the detected current. The conductors 41–43 are coupled to the wafer disk through a capacitor $C_2$, while the conductor frame 42 is also coupled to the wafer disk 31 through a capacitor $C_1$. The capacitance of the capacitor $C_2$ connected to the conductor 43 is for example of the order of several tens nano-farads. When the conductors 41 and 42 are irradiated by charged particles and receive charges $Q_2$ and $Q_1$, there will be induced voltages $V_2$ and $V_1$ across the capacitors $C_2$ and $C_1$, $$V_2 = Q_2/C_2, \text{ and } V_1 = Q_1/C_1.$$

The voltages $V_2$ and $V_1$ will be small when the capacitances $C_2$ and $C_1$ are large, and will be large when the capacitances $C_2$ and $C_1$ are small. However, if the sensitivity is made too high, a small amount of injected charge will change the value of $V_2$ and $V_1$ widely to increase the noise. On the contrary, if the sensitivity is set too low, the charge on the wafer may not be detected. The sensitivity of charge detection can be adjusted by controlling the capacitance $C_2$. Also, the effect of disturbance prevention can be adjusted by varying the capacitance $C_1$.

In other words, on the disk 31, the conductors 41 and 43 are capacitively coupled with the wafer disk 31 with a capacitance $C_2$. Upon reception of charge $Q_2$, a voltage $V_2 = Q_2/C_2$ is established. The conductor frame 62 on the rear face is grounded to the disk 31 and is held at the disk potential. The conductor frame 42 on the front face of the disk 31 is capacitively coupled with the wafer disk 31 with a capacitance $C_1$. Upon reception of charge $Q_1$, a voltage $V_1=Q_1/C_1$ will be generated to prevent the entering of secondary electrons from the surroundings into the conductor 41.

Figure 8:
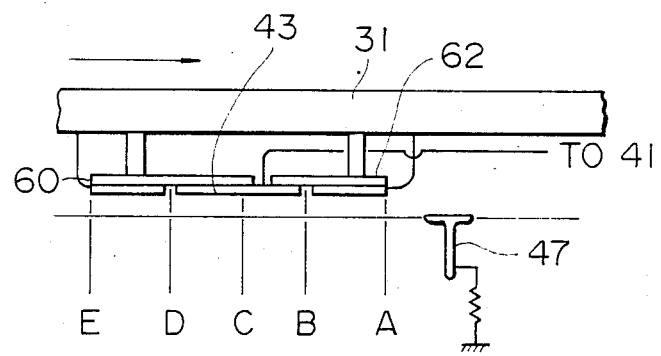
FIG. 8 is a cross-section showing positional relation between the static charge inducing conductor and the disturbance preventing member.
Figure 9:
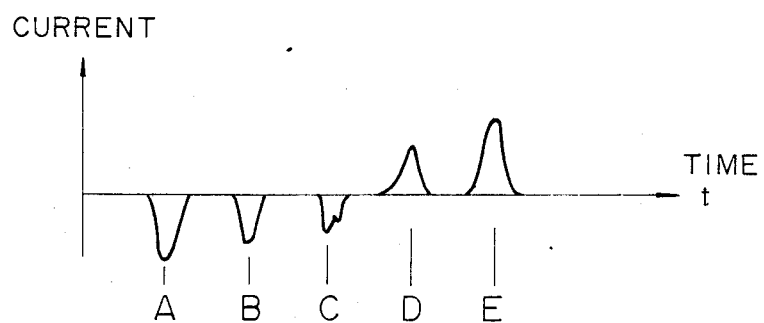
FIG. 9 is a graph showing the current flowing into and out of the monitoring capacitor plate in the structure of FIG. 3.

Now, the operation of the charge detecting system will be described. The static charge inducing conductor 43 and the disturbance preventing frame 62 rotates with the wafer disk 31 at a high speed and pass by the stationary capacitor electrode 47 fixed on the disk chamber cover 16 to induce a signal on the capacitor electrode 47. As the capacitor electrode 47 goes from point A to point E in FIG. 8, a signal as shown in FIG. 9 will be generated by induction. Here, it is assumed that a certain voltage Vd is applied to the disturbance preventing conductor 62 and a charge-up voltage Vc (Vc>Vd) is applied to the conductors 41–43. Assuming that the current flowing out of the stationary capacitor electrode 47 is positive, the current variation obtained from the capacitor electrode 47 upon passage of A–E is as shown in FIG. 9. In FIG. 9, the magnitude of the signal at points B and D corresponds to the charge on the wafer 35 or the conductor strip 41. Control is effected to reduce the magnitude of this signal below a certain value during the ion implantation by adjusting the amount of secondary electrons emitted from the electron shower 25 and/or applying a voltage to the wafer disk 31. Such control can be done manually by monitoring an oscilloscope or automatically by automatically reading the peak value of the signals B and/or D and feeding back the result to the electron shower to change the amount of the secondary electrons and/or applying an appropriate voltage to the wafer disk 31 in a control system 50 as shown in FIG. 1.

Figure 10A:
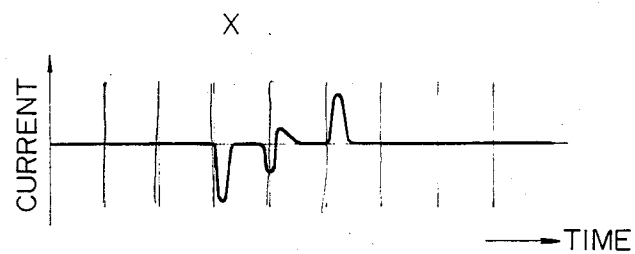
FIGS. 10A, 10B, 11A and 11B are graphs of signal waveforms derived from the charge-up monitoring system of the structure of FIG. 3.
Figure 10B:
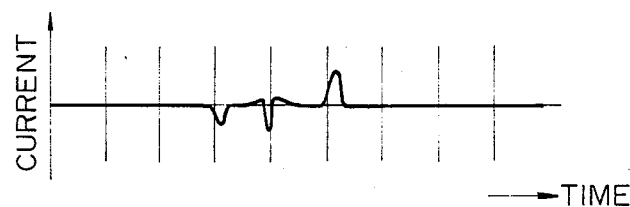

FIGS. 10A and 10B show the data when the charge monitoring system is used. The data in FIGS. 10A and 10B show variations of signal waveform when the electron shower is used. FIG. 10A represents the case when the electron shower is not used and FIG. 10B shows the case when the electron shower is used. From the comparison of the two figures, it will be apparent how the appropriate use of electron shower is effective for reducing the charge. Namely, the signal shown at portion X indicates the voltage at the conductive member 41, i.e. isolated conductor on the wafer. When the electron shower is used, the signal at X is reduced, indicating the reduction in the charge on the isolated conductor.

Figure 11A:
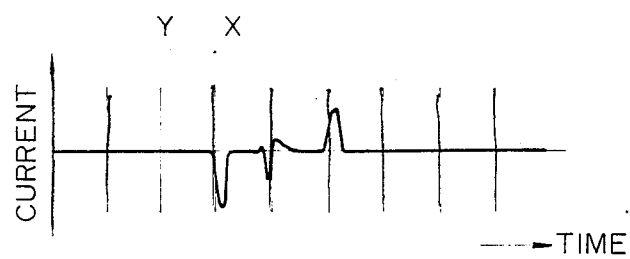
Figure 11B:
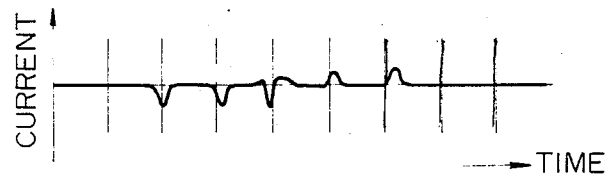

FIGS. 11A and 11B show the results when a voltage is positively applied on the wafer disk 31. The signal at Y represents the voltage on the wafer disk 31 and the signal at X represents the voltage at the isolated conductor 41. FIG. 11A represents the charge-up signal when no voltage is applied to the wafer disk 31 while FIG. 11B represents the corresponding signal when a voltage is applied to the wafer disk 31. There can be seen a large difference between the two.

Compared to FIG. 10B, the signal at point X is reduced in FIG. 11B, representing a remarkable reduction in the voltage on the isolated conductor 41.

In this way, the charge on the wafer can be measured precisely by a simple structure without accompanying excessive noise in the detected signal.

Figure 12A:
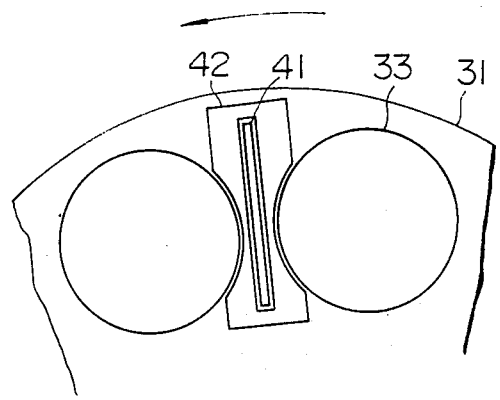
FIGS. 12A, 12B, 12C, 13A, 13B, and 13C are diagrams showing configurations of the charge suscepting conductor and the charge inducing conductor provided on the wafer disk.
Figure 12B:
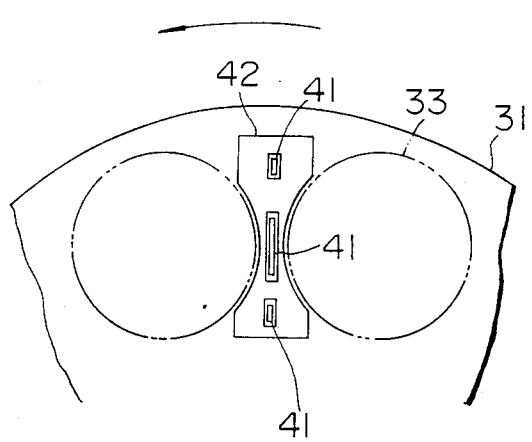
Figure 12C:
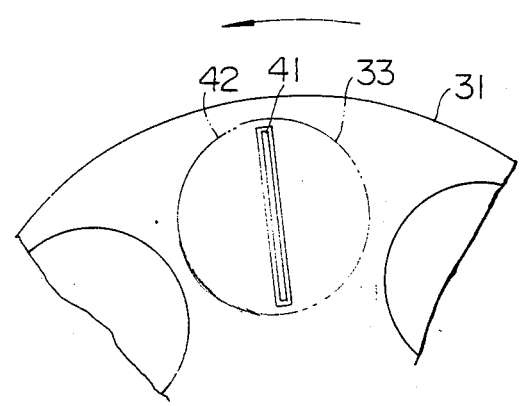

Various configurations and arrangements are possible for the conductive members 41 and 43, and the conductive frames 42 and 62. FIGS. 12A, 12B and 12C show examples of the conductive member 41 and the surrounding conductive frame 42 on the front face of the wafer disk 31. FIG. 12A shows an example where the conductive frame 42 extends along wafer susceptors 33. FIG. 12B shows a modification where isolated three conductor members 41 replace a single conductor member. This configuration is fitted for measuring the variation of charge accompanied with the radial scan of the ion beam. Further, the configuration of FIG. 12B enables the monitor of charge in the non-irradiated portion. When the ion beam is radially or vertically scanned, the conductive member 41 of FIG. 12A receives the ions at any time. That is, the amount of charge can be monitored all the time, but the charge state in the non-irradiated portion cannot be measured. In the configuration of FIG. 12B, in the radial scan of the ion beam, charge states at the beam-irradiated portion and at the non-irradiated portion can be simultaneously monitored. FIG. 12C shows the case where one wafer susceptor is used for forming a monitor.

Figure 13A:
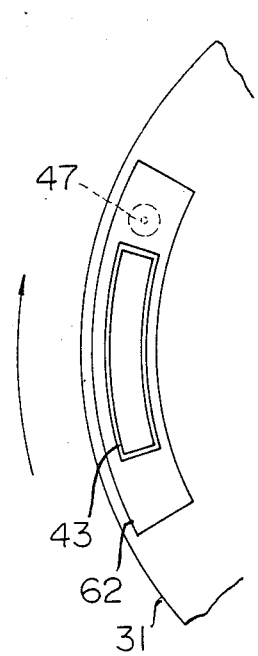
Figure 13B:
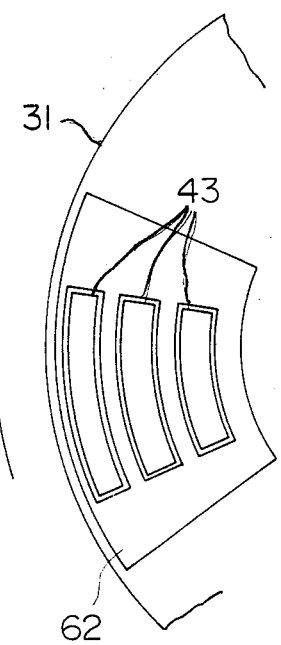
Figure 13C:
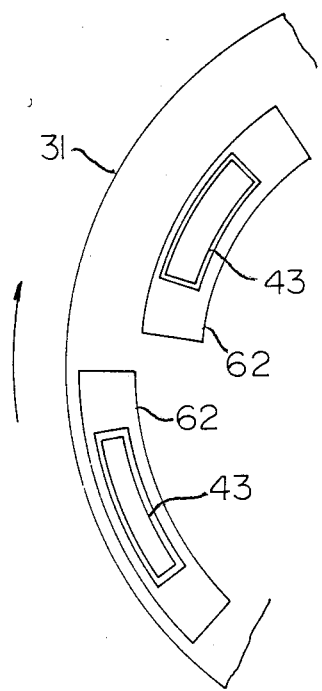

FIGS. 13A, 13B and 13C show examples of configurations of the conductive member 43 and the conductive frame 62 on the rear surface of the wafer disk 31. FIG. 13A represents a case where the conductive member 43 is disposed along the circumference of the wafer disk 31. When the disk is rotated, the speed of the conductive member 43 will be proportional to the radial position of the conductor 43. The ac voltage to be obtained at the stationary capacitor electrode 47 by the variation of the induced charge will be larger when the speed of the charged conductor 43 is faster. Thus, it is considered that the peripheral configuration of the capacitor plate 47 will enable a higher signal voltage compared to the inner configuration. However, it is confirmed by the following experiments that a sufficiently good sensitivity is obtainable even when the peripheral configuration is not adopted. FIG. 13B shows a case corresponding to the case shown in FIG. 12B. The three front conductors 41 in FIG. 12B are connected to the three rear conductors 43 in FIG. 13B, enabling monitoring of the charge states at the irradiated portion and at the non-irradiated portion, simultaneously. Also, the difference between the central portion and the peripheral portion can be known. FIG. 13C shows an example where a plurality of conductors 43 are disposed with both the radial and the azimuthal off-sets. The conductive frame 62 may be unitary as shown in FIG. 12B, or be separated as shown in FIG. 13C.

We claim:

1. An ion implanting apparatus for implanting ions into a plurality of workpieces, comprising:
   a rotatable disk having a front and a rear face, for mounting a plurality of workpieces on the front face;
   disk chamber means for defining a hermetic space and containing said disk therein;
   a first conductor member disposed on the front face of said disk;
   a second conductor member disposed on the rear face of said disk and electrically connected to said first conductor member; and
   a third conductor member fixed to said disk chamber means and disposed in the vicinity of the passage of said second conductor member and capacitively coupled to said second conductor member, whereby the charged state of the first conductor is monitored by the electrical state of the third conductor member.

2. An ion implanting apparatus according to claim 1, wherein said disk is made of metal and said first and second conductor members are electrically isolated from the disk.

3. An ion implanting apparatus according to claim 2, further comprising a first shielding conductor surrounding the first conductor and isolated from said disk.

4. An ion implanting apparatus according to claim 2, further comprising a second shielding conductor surrounding the second conductor on the rear face of the disk and electrically connected with said disk.

5. An ion implanting apparatus according to claim 2, further comprising a first capacitor of a predetermined capacitance connected between said disk and said first and second conductor members.

6. An ion implanting apparatus according to claim 3, further comprising a second capacitance connected between said first shielding conductor and said disk.

7. An ion implanting apparatus according to claim 1, further comprising an electron source capable of supplying electrons to the front face of said disk.

8. An ion implanting apparatus according to claim 7, further comprising means for controlling said electron source in dependence on the charge state of said third conductor.

9. An ion implanting apparatus according to claim 8, wherein said electron source includes an electron gun for emitting primary electrons and a target for receiving the primary electrons and emitting secondary electrons upon the irradiation of the primary electrons.

10. An ion implanting apparatus according to claim 9, further comprising a plurality of workpiece susceptors disposed on the front face of said disk in a peripheral portion along the circumference of the disk, wherein said first conductor member extends between a pair of workpiece susceptors and covering the whole radial scan length of the ion beam.

* * * * *